US005803973A

United States Patent [19]

Szczyrbowski et al.

[11] Patent Number: 5,803,973
[45] Date of Patent: Sep. 8, 1998

[54] APPARATUS FOR COATING A SUBSTRATE BY CHEMICAL VAPOR DEPOSITION

[75] Inventors: Joachim Szczyrbowski, Goldbach; Götz Teschner, Hanau, both of Germany

[73] Assignee: Balzers und Leybold Deutschland Holding AG, Hanau am Main, Germany

[21] Appl. No.: 725,156

[22] Filed: Oct. 3, 1996

[30] Foreign Application Priority Data

Oct. 31, 1995 [DE] Germany ........................ 195 40 543.9

[51] Int. Cl.[6] .................................................... C23C 16/00

[52] U.S. Cl. .................................... 118/723 ER; 118/719; 118/723 E; 118/50.1; 204/298.19; 204/298.25; 204/298.26; 315/111.21

[58] Field of Search ................................ 118/719, 723 E, 118/723 ER, 50.1; 204/298.19, 298.25, 298.26; 315/111.21

[56] References Cited

U.S. PATENT DOCUMENTS

| | | | |
|---|---|---|---|
| 4,405,436 | 9/1983 | Kobayashi et al. | 204/298 |
| 4,572,842 | 2/1986 | Dietrich et al. | 427/39 |
| 4,668,373 | 5/1987 | Rille et al. | 204/298 |
| 4,931,158 | 6/1990 | Bunshah et al. | 204/192.29 |
| 4,956,070 | 9/1990 | Nakada et al. | 204/298.18 |
| 4,982,269 | 1/1991 | Calligaro | 357/56 |
| 4,983,269 | 1/1991 | Wegmann | 204/192.13 |
| 5,126,033 | 6/1992 | Szczyrbowski et al. | 204/289.08 |
| 5,167,789 | 12/1992 | Latz | 204/298.11 |
| 5,169,509 | 12/1992 | Latz et al. | 204/298.03 |
| 5,240,584 | 8/1993 | Szczyrbowski et al. | 204/298.08 |
| 5,316,585 | 5/1994 | Okamoto et al. | 118/719 |
| 5,334,298 | 8/1994 | Gegenwart | 204/192.12 |
| 5,368,676 | 11/1994 | Nagaseki et al. | 156/345 |
| 5,399,252 | 3/1995 | Scherer et al. | 204/298.19 |
| 5,490,910 | 2/1996 | Nelson et al. | 204/192.15 |
| 5,605,576 | 2/1997 | Sasaki et al. | 118/723 E |
| 5,628,889 | 5/1997 | Gardell et al. | 204/298.09 |
| 5,635,036 | 6/1997 | Demaray et al. | 204/192.12 |
| 5,637,180 | 6/1997 | Gosain et al. | 156/345 |

FOREIGN PATENT DOCUMENTS

| | | | |
|---|---|---|---|
| 4239843 | 6/1994 | Germany . | |
| 4326100 | of 1995 | Germany . | |
| 1-293521 | 11/1989 | Japan | 118/723 ER |
| 4-100215 | 4/1992 | Japan | 118/723 E |

OTHER PUBLICATIONS

Schiller, Hochrate–Sputtertechnik und deren Einsatz in verschiedenen Industriezweigen. Vakuum–Technik, 37. Jg., H. Jun. 1988, S. 162–174.

Schiller, Verfahren und Einsatzmöglichkeiten des Plasmatron–Hochrate zerstäubens. Vakuum–Technik, 30.Jg., H. 4, S. 195–207.

Kienel, Moderne Beschichtungstechnnologien von Architekturglas Vakuum–Technik, 30. Jg., H. 8, S. 236–245.

*Primary Examiner*—R. Bruce Breneman
*Assistant Examiner*—Jeffrie R. Lund
*Attorney, Agent, or Firm*—Felfe & Lynch

[57] ABSTRACT

A source of alternating current (3), is connected to two magnetron cathodes (4, 5), one pole (8) of the a.c. current source (4) being connected to one of the cathodes (4), while the other pole (9) is connected to the other cathode (5), each by its own power supply line (10, 11). Each of the two cathodes (4, 5) is installed in its own compartment (12, 13), the two compartments enclosing between them a third compartment (14), connected to a vacuum source (21). The two outside compartments (12, 13) are connected to each other by openings (15, 16) or gaps in the walls (17, 18) separating them, and the substrate (2) set up in the third compartment (14) facing a CVD source, which consists essentially of a reactive gas inlet (19) and a collimator (20).

3 Claims, 2 Drawing Sheets

APPARATUS FOR COATING A SUBSTRATE BY CHEMICAL VAPOR DEPOSITION

BACKGROUND OF THE INVENTION

The invention pertains to an apparatus for coating a substrate by plasma CVD, consisting of a source of alternating current such as a medium-frequency generator, which is connected to two cathodes enclosing magnets. The cathodes interact electrically with targets, which are sputtered, one pole of the A.C. current source being connected to one of the two cathodes while the other pole is connected to the other cathode, each by its own supply line.

DD 252 205 discloses a sputtering apparatus for the production of thin layers including a system of magnets and at least two electrodes mounted above them, carrying the material to be sputtered. These electrodes are set up electrically in such a way that they alternate between being the cathodes and anodes of a gas discharge. For this purpose, the electrodes are connected to a sinusoidal alternating voltage of preferably 50 Hz.

This known sputtering apparatus is said to be suitable especially for the deposition of dielectric layers by reactive sputtering. Through the operation of the device at about 50 Hz, it is said that the formation of "tinsel" at the anode and electrical short-circuits (so-called arcs) during the coating of metal can be prevented.

U.S. Pat. No. 4,956,070 discloses an apparatus for the application of thin films by sputtering, where the rate at which layers of different materials are deposited can be controlled, so that extremely thin layer packages can be produced. At least two different types of counterelectrodes are installed on the cathode side.

DE 35 41 621 discloses an arrangement for depositing a metal alloy by means of HF sputtering, in which two targets are driven in alternation, the targets containing the metal components of the metal alloy to be deposited but in different proportions. The substrates are for this purpose mounted on a substrate carrier, which is rotated by drive unit during the sputtering operation.

DE 38 02 852 discloses an apparatus for coating a substrate, the apparatus having two electrodes and at least one material to be sputtered, wherein the alternating current half-waves used can be low-frequency half-waves with essentially equal amplitudes. The substrate to be coated can be set up between and a certain distance away from the two electrodes.

U.S. Pat. No. 5,169,509 discloses for the reactive coating of a substrate with an electrically insulating material such as silicon dioxide ($SiO_2$), the apparatus consisting of an alternating current source, which is connected to cathodes enclosing magnets installed in a coating chamber, the cathodes working together with targets. Each of the two ungrounded outputs of the alternating current source is connected to one of the cathodes, which carry targets. The two cathodes in the coating chamber are set up next to each other in a plasma space, and they are both about the same distance away from the substrate which faces them. The effective value of the discharge voltage is measured by an effective voltage detection unit connected by a line to the cathode and sent as direct voltage over a line to a controller; the controller adjusts the flow of reactive gas from a tank to the distribution line by way of a control valve in such a way that the measured voltage agrees with a nominal (desired) voltage.

U.S. Pat. No. 5,415,757 discloses a device for coating a substrate especially with nonconductive layers by electrically conductive targets in a reactive atmosphere. A current source is connected to cathodes which enclose magnets and are installed in an evacuatable coating chamber. The cathodes work together electrically with the targets. Two anodes, separated electrically from each other and from the sputtering chamber, are installed on a plane between the cathodes and the substrate. Each of the two outputs of the secondary winding of a transformer connected to a medium-frequency generator is connected to one of the cathodes by way of a power supply line. The first and second supply lines are connected to each other by a branch line, into which an oscillatory circuit, preferably a coil and a capacitor, is inserted. Each of the two supply lines is connected to the coating chamber by way of a first electric element, which adjusts the direct voltage potential with respect to ground; to the associated anode by way of a corresponding second electric element; and also to the coating chamber by way of a branch line with an inserted capacitor. A choke coil is inserted into the section of the first supply line which connects the oscillatory circuit to the second terminal of the secondary.

SUMMARY OF THE INVENTION

Whereas the known devices deal with the problem of arcing, that is, with the problem of preventing the formation of undesirable electric arcs and of protecting the surface of the target from the formation of insulating layers, the goal of the present invention is to provide an apparatus suitable for generating widely extended, uniform, dense plasma in a plasma chemical vapor deposition system.

According to the present invention, each cathode is installed in its own chamber or compartment, and these two cathode compartments enclose between them a third compartment connected to a vacuum source and are connected to each other by openings or gaps in the walls separating the compartments from each other. The substrate mounted in the third compartment is aligned with a CVD source, which is formed by a reactive gas inlet and a collimator.

DETAILED DESCRIPTION OF THE PREFERRED EMBODIMENTS

Figure 1:
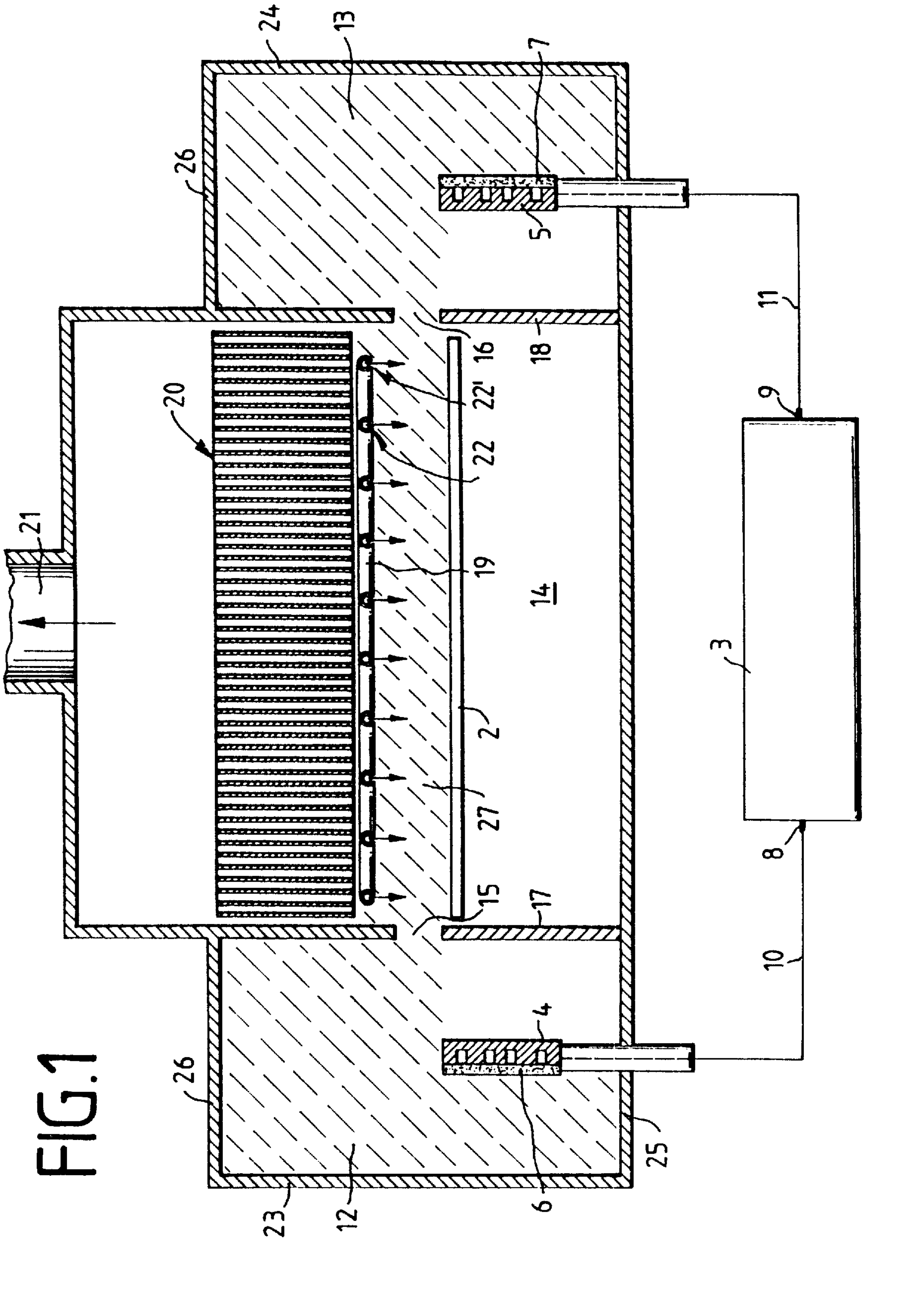
FIG. 1 is a schematic side section view of a first embodiment.

The apparatus according to FIG. 1 consists of a large vacuum chamber, which is divided into three compartments 12, 13, 14, the three compartments being connected to each other by gaps 15, 16 in the walls 17, 18, which separate the compartments from each other. The central compartment of 14 has a grid-like reactive gas manifold 19, which is provided with numerous outlet nozzles 22, through which the process gas is discharged toward a plate-like substrate 2, the plane of the substrate being parallel to the plane of reactive gas manifold 19. Above reactive gas manifold 19 is a collimator 20, which serves to homogenize the gas flowing over substrate 2. The reactive gas first flows downward in the direction shown by the arrows, then turns around and flows around the marginal areas of the collimator to the space thereabove, before being drawn down again through the collimator. The collimator itself is formed by a plurality of individual tubes, all of which are parallel to each other and which together form a kind of grid. The vacuum pump is connected at 21, through which all three compartments 12,

13, 14 are evacuated. In each of the two side compartments 12, 13, a cathode 4, 5 is provided, the targets 6, 7 of which face side walls 23, 24. Each of the two cathodes 4, 5 is connected by a line 10, 11 to a medium-frequency generator 3. During the sputtering operation, a plasma cloud spreads out to fill compartments 12, 13 and also reaction space 27 in particular, so that, when the process gas emerges from nozzles 22, in the direction of the arrow, wear-resistant and/or corrosion-proofing layers can be formed on substrate 2 by chemical deposition from the gas phase.

Figure 2:
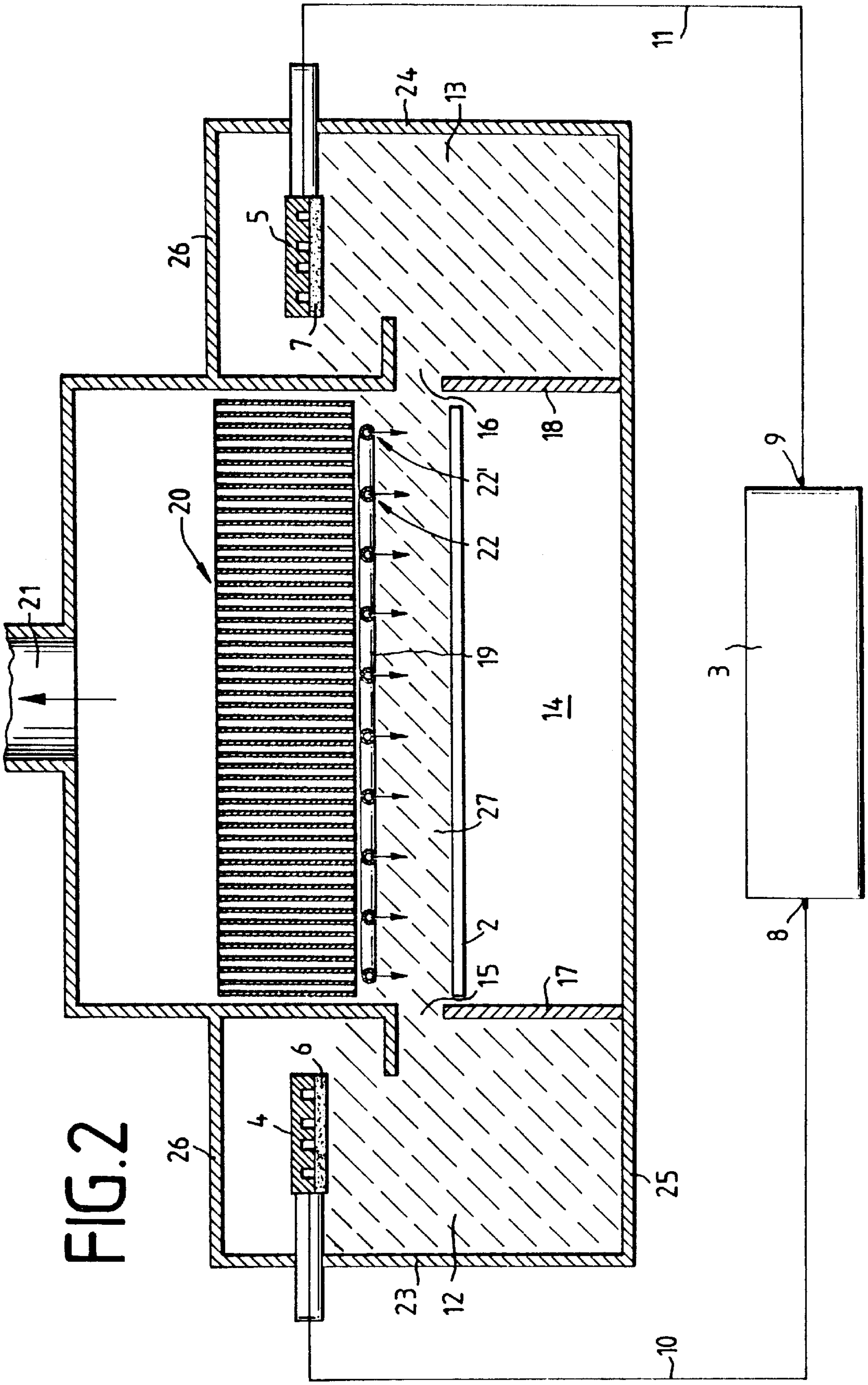
FIG. 2 is a schematic side section view of a second embodiment.

The exemplary embodiment according to FIG. 2 differs from that according to FIG. 1 only in that cathodes 4, 5 are aligned with their targets 6, 7 the bottom sections 25 of compartments 12, 13. In both embodiments, cathodes 4, 5 are operated with alternating voltage, which "floats" with respect to compartment walls 23, 24; 25, 26. A plasma forms between the two targets 6, 7 and carries all the discharge current of the magnetron.

The apparatus offer the following advantages:

1. The plasma production space is separated from CVD reaction space 27, which leads to a significant reduction in the amount of material deposited on the electrodes (in this case, on the targets of the magnetrons).

2. Because the plasma production space is separated from reaction space 27, it is possible to keep high-energy electrons and ions away from the CVD reaction space. The high-energy electrons and ions are especially undesirable during the coating of plastics, because the polymer chains on the surface are destroyed by bombardment with charge carriers.

3. Although the sputtering effect of magnetrons 4,5 is undesirable in this case, it is nevertheless not disadvantageous, because the sputtered-off particles are trapped in the separated plasma production spaces, i.e., in compartments 12, 13, for which reason the layers on the substrates cannot become contaminated.

4. Through the use of magnetrons 4, 5, the plasma density is 10 times greater than that of systems without magnetrons.

5. The plasma band extending between the outside compartments carries all the discharge current. Thus, in contrast to all other designs, the high-current plasma is conducted directly past substrates 2. It is also possible to set up substrates 2 directly in the current.

We claim:

1. Apparatus for coating a substrate, said apparatus comprising

- a vacuum chamber comprising a central compartment and two outer compartments separated from said central compartment by two respective walls, each wall having an opening therein,
- a magnetron cathode in each of said outer compartments,
- an A.C. current source having two poles, each pole connected to a respective said cathode,
- reactive gas inlet means comprising a collimator and a plurality of nozzles in said central compartment for collimating gas flow into a reaction space between said openings, whereby,
- a plasma can be created in said reaction space for coating a substrate opposite said nozzles by chemical vapor deposition.

2. Apparatus as in claim 1 wherein each said magnetron cathode comprises a target which faces away from the opening of the outer compartment in which said target is located.

3. Apparatus as in claim 1 wherein each said magnetron cathode comprises a downward facing target located above the opening in the outer compartment in which said target is located.

* * * * *